(12) United States Patent
Kwak et al.

(10) Patent No.: US 10,636,953 B2
(45) Date of Patent: Apr. 28, 2020

(54) THERMOELECTRIC CONVERSION MODULE AND METHOD FOR MANUFACTURING THE SAME

(71) Applicants: Hyundai Motor Company, Seoul (KR); Kia Motors Corporation, Seoul (KR)

(72) Inventors: Jin Woo Kwak, Gyeongsan-si (KR); Kwang Min Choi, Seoul (KR); Byung-Wook Kim, Seongnam-si (KR); Hoo Dam Lee, Seongnam-si (KR); Ho Chan An, Hwaseong-si (KR); Jong Ho Seon, Seoul (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 0 days.

(21) Appl. No.: 16/165,304

(22) Filed: Oct. 19, 2018

(65) Prior Publication Data

US 2019/0393396 A1    Dec. 26, 2019

(30) Foreign Application Priority Data

Jun. 26, 2018    (KR) .................. 10-2018-0073363

(51) Int. Cl.
*H01L 35/32* (2006.01)
*H01L 35/30* (2006.01)
*H01L 35/34* (2006.01)
*F01N 5/02* (2006.01)

(52) U.S. Cl.
CPC .............. *H01L 35/32* (2013.01); *F01N 5/025* (2013.01); *H01L 35/30* (2013.01); *H01L 35/34* (2013.01)

(58) Field of Classification Search
CPC .......... H01L 35/32; H01L 35/30; H01L 35/34
See application file for complete search history.

(56) References Cited

U.S. PATENT DOCUMENTS

| | | | | |
|---|---|---|---|---|
| 3,539,399 A | * | 11/1970 | Harvey | H01L 35/06 136/212 |
| 4,497,973 A | * | 2/1985 | Heath | H01L 35/32 136/205 |
| 6,121,539 A | * | 9/2000 | Johnson | H01L 23/38 136/203 |
| 2006/0042676 A1 | * | 3/2006 | Sogou | H01L 35/06 136/212 |

(Continued)

*Primary Examiner* — Golam Mowla
(74) *Attorney, Agent, or Firm* — Morgan, Lewis & Bockius LLP (57) ABSTRACT

A thermoelectric conversion module may include a plurality of n type thermoelectric conversion materials and a plurality of p type thermoelectric conversion materials that are disposed alternately, and a plurality of electrodes that connects the plurality of thermoelectric conversion material disposed alternately on one side and on an opposite side alternately, wherein the plurality of electrodes may include a high temperature side electrode configured to protrude towards a pipe, through which a heat transfer fluid flows, with respect to high temperature side end portions of the plurality of thermoelectric conversion materials and to be inserted into a through-hole formed at the pipe to obtain heat while directly contacting the heat transfer fluid and to transfer the obtained heat to the plurality of thermoelectric conversion materials.

13 Claims, 9 Drawing Sheets

(56) References Cited

U.S. PATENT DOCUMENTS

| | | | |
|---|---|---|---|
| 2006/0112982 A1* | 6/2006 | Maruo | H01L 35/30 |
| | | | 136/204 |
| 2009/0014046 A1* | 1/2009 | Yu | H01L 35/32 |
| | | | 136/200 |
| 2009/0126772 A1 | 5/2009 | Machida | |
| 2011/0139206 A1* | 6/2011 | Ukita | H01L 35/06 |
| | | | 136/224 |
| 2014/0230875 A1* | 8/2014 | Angermann | H01L 35/34 |
| | | | 136/230 |

* cited by examiner

THERMOELECTRIC CONVERSION MODULE AND METHOD FOR MANUFACTURING THE SAME

CROSS-REFERENCE TO RELATED APPLICATION

The present application claims priority to Korean Patent Application No. 10-2018-0073363, filed on Jun. 26, 2018, the entire contents of which is incorporated herein for all purposes by this reference.

BACKGROUND OF THE INVENTION

Field of the Invention

The present invention relates to a thermoelectric conversion module and a method for manufacturing the same.

Description of Related Art

Generally, a thermoelectric module is used for a thermoelectric power generation system using a Seebeck effect of generating an electromotive force by use of a temperature difference between opposite surfaces thereof.

During thermoelectric power generation by the thermoelectric module, an output of the thermoelectric power generation may be enhanced by maintaining a temperature difference between a high temperature portion and a low temperature portion at a large value. As such, a heat transfer rate of heat from a heat source to a thermoelectric module greatly influences the output of the power generation.

An example of a field that utilizes thermoelectric power generation by use of the thermoelectric module may include use of waste heat of an exhaust system of a vehicle as a representative example.

Because the conventional thermoelectric module receives heat while contracting a surface of an exhaust pipe of the vehicle, heat is lost on an interface between the thermoelectric module and the exhaust pipe. Accordingly, it is difficult to increase the temperature of a high temperature portion of the thermoelectric module to a specific temperature or higher, and thus there is a limit in improving the thermoelectric performance.

To solve the problems, a structure of a thermoelectric module which may increase the temperature of a high temperature portion of the thermoelectric module by effectively using the heat in exhaust gas has been required.

The information disclosed in this Background of the Invention section is only for enhancement of understanding of the general background of the invention and may not be taken as an acknowledgement or any form of suggestion that this information forms the prior art already known to a person skilled in the art.

BRIEF SUMMARY

Various aspects of the present invention are directed to providing a structure of a thermoelectric conversion module which may increase the temperature of a high temperature portion of a thermoelectric conversion module while directly contacting a heat transfer fluid (for example, exhaust gas of a vehicle) of high temperature.

Various aspects of the present invention are to maintain thermoelectric performance by improving the durability of a thermoelectric conversion module which is exposed to high temperature and vibration.

Various aspects of the present invention are to provide a method for manufacturing the above-mentioned thermoelectric conversion module.

In accordance with an aspect of the present invention, there is provided a thermoelectric conversion module including a plurality of n type thermoelectric conversion materials and a plurality of p type thermoelectric conversion materials that are disposed alternately, and a plurality of electrodes that connect the plurality of thermoelectric conversion materials disposed alternately on high temperature sides and low temperature sides of the plurality of thermoelectric conversion materials alternately.

The plurality of electrodes may include a high temperature side electrode which is inserted into a through-hole formed in a pipe, through which a heat transfer fluid flows, to obtain heat while directly contacting the heat transfer fluid and protrudes toward the pipe, through which the heat transfer fluid flows, with respect to high temperature side end portions of the plurality of thermoelectric conversion materials to transfer the obtained heat to the plurality of thermoelectric conversion materials.

In accordance with another aspect of the present invention, there is provided a method for manufacturing a thermoelectric conversion module including a plurality of n type thermoelectric conversion materials and a plurality of p type thermoelectric conversion materials that are disposed alternately, and plate type high temperature side electrodes that are inserted between the n type thermoelectric conversion materials and the p type thermoelectric conversion materials, the method including (a) sequentially arranging the n type thermoelectric conversion materials, the high temperature side electrodes, the p type thermoelectric conversion materials, and supporters alternately such that the n type thermoelectric conversion materials, the high temperature side electrodes, the p type thermoelectric conversion materials, and the supporters overlap each other, and (b) heating end portions of the high temperature side electrodes, opposite end portions of which are inserted between the thermoelectric materials, while pressing the n type thermoelectric conversion materials, the high temperature side electrodes, the p type thermoelectric conversion materials, and the supporters to weld the n type thermoelectric conversion materials, the high temperature side electrodes, the p type thermoelectric conversion materials, and supporters.

The methods and apparatuses of the present invention have other features and advantages which will be apparent from or are set forth in more detail in the accompanying drawings, which are incorporated herein, and the following Detailed Description, which together serve to explain certain principles of the present invention.

It may be understood that the appended drawings are not necessarily to scale, presenting a somewhat simplified representation of various features illustrative of the basic principles of the invention. The specific design features of the present invention as disclosed herein, including, for example, specific dimensions, orientations, locations, and shapes will be determined in part by the particularly intended application and use environment.

In the figures, reference numbers refer to the same or equivalent parts of the present invention throughout the several figures of the drawing.

DETAILED DESCRIPTION

Reference will now be made in detail to various embodiments of the present invention(s), examples of which are illustrated in the accompanying drawings and described below. While the invention(s) will be described in conjunction with exemplary embodiments of the present invention, it will be understood that the present description is not intended to limit the invention(s) to those exemplary embodiments. On the other hand, the invention(s) is/are intended to cover not only the exemplary embodiments of the present invention, but also various alternatives, modifications, equivalents and other embodiments, which may be included within the spirit and scope of the invention as defined by the appended claims.

Hereinafter, various exemplary embodiments of the present invention will be described in detail with reference to the accompanying drawings. Throughout the specification, it is noted that the same or like reference numerals denote the same or like components even though they are provided in different drawings. Furthermore, in the following description of the present invention, a detailed description of known functions and configurations incorporated herein will be omitted when it may make the subject matter of the present invention rather unclear.

Figure 1:
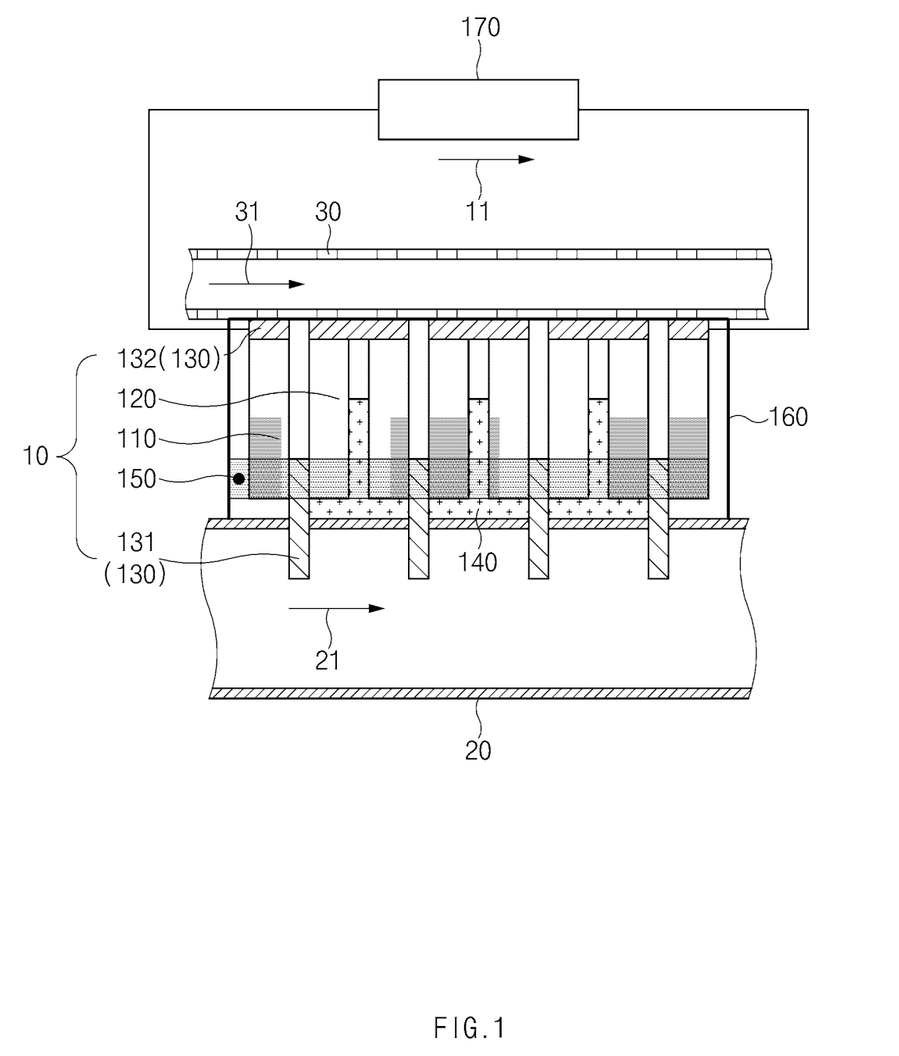
FIG. 1 is a conceptual view illustrating a thermoelectric conversion module according to various exemplary embodiments of the present invention.

FIG. 1 is a block diagram illustrating a fuel cell system according to various exemplary embodiments of the present invention.

The thermoelectric conversion module 10 according to the exemplary embodiment includes a plurality of n type thermoelectric conversion materials 110 and a plurality of p type thermoelectric conversion materials 120 that are disposed alternately, and a plurality of electrodes 130 that alternately connect the plurality of alternately disposed thermoelectric conversion materials on a high temperature side and a low temperature side thereof.

The n type thermoelectric conversion materials 110 may include n type semiconductor devices.

The p type thermoelectric conversion materials 120 may include p type semiconductor devices.

The plurality of electrodes 130 may be configured to electrically connect the n type thermoelectric conversion material 110 and the p type thermoelectric conversion materials 120 in series.

The plurality of electrodes 130 may include high temperature side electrodes 131 that electrically connect lower end portions (or high temperature side end portions) of the n type thermoelectric conversion materials 110 and lower end portions (or high temperature side end portions) of the p type thermoelectric conversion materials 120, and low temperature side electrodes 132 that electrically connect upper end portions (or lower side end portions) of the n type thermoelectric conversion materials 110 and upper end portions (or low temperature side end portions) of the p type thermoelectric conversion materials 120.

Meanwhile, it is more advantageous if a temperature difference of the high temperature parts and the low temperature parts of the thermoelectric conversion materials is larger to improve the power generation performance of the thermoelectric conversion module 10. For example, the thermoelectric conversion module 10 may be used to reduce the load of the battery of the vehicle by recycling heat of the exhaust gas of the vehicle. Conventionally, the heat which is lost on an interface of an exhaust pipe and a thermoelectric conversion module is large so that the power generation efficiency deteriorates because the thermoelectric conversion module is attached to a surface of the exhaust pipe of the vehicle.

The exemplary embodiment of the present invention relates to a thermoelectric conversion module that directly contacts a heat transfer fluid to minimize heat which is lost when heat is transferred from a heat transfer fluid to the thermoelectric conversion module. In more detail, the basic feature of the thermoelectric conversion module according to the exemplary embodiment of the present invention is to include an electrode that protrudes towards a pipe, through which a heat transfer fluid flows, such that the electrode is inserted into a through-hole formed in the pipe, through which the heat transfer fluid flows, to obtain heat while directly contacting the heat transfer fluid and transfer the obtained heat to a plurality of thermoelectric conversion materials.

Here, the heat transfer fluid may be a heat transfer fluid of high temperature or may be a heat transfer fluid (that is, a refrigerant) of low temperature.

When directly contacting the heat transfer fluid of high temperature, the electrode may be inserted into the through-hole formed in the high temperature passage pipe to absorb thermal energy from the heat transfer fluid of high temperature. Furthermore, when directly contacting the heat transfer fluid of low temperature, the electrode may be inserted into the through-hole formed in the low temperature passage pipe to emit thermal energy to the refrigerant.

Although it will be described below as an example that the high temperature side electrode is inserted into the high temperature passage pipe, it may be understood by an ordinary person in the art that the low temperature side electrode may be inserted into the internal of the low temperature passage pipe in the same or equivalent scheme.

The features of the thermoelectric conversion module according to the exemplary embodiment will be described below in more detail.

Referring to FIG. 1, a portion of the high temperature side electrode 131 may be inserted into and welded to the n type thermoelectric conversion materials 110 and the p type thermoelectric conversion materials 120.

The high temperature side electrode 131 is of a plate type, and one end portion of the high temperature side electrode 131 may be inserted into the high temperature passage pipe 20 and an opposite end portion of the high temperature side electrode 20 may be inserted between and welded to the n type thermoelectric conversion material 110 and the p type thermoelectric conversion material 120. Through this, because heat absorbed from a heat transfer fluid 21 may be linearly moved along the high temperature side electrode 131 and may be delivered to the thermoelectric conversion materials 110 and 112, thermal stresses may be concentrated at a portion of the high temperature side electrode 131 to be prevented from being damaged.

That is, when the electrode is curved or bent, thermal stresses are concentrated relatively at the curved or bent portion so that the electrode may be damaged at a relatively low temperature, and the high temperature side electrode 131 according to the exemplary embodiment extends long upwards and downwards in a plate type and may maintain its properties even at a relatively high temperature.

The high temperature side electrode 131 may be inserted to a point which is not more than ⅓ of a length from the high temperature side end portions of the n type thermoelectric conversion material 110 and the p type thermoelectric conversion material 120 to the low temperature side end portions of the n type thermoelectric conversion material 110 and the p type thermoelectric conversion material 120 to be welded. That is, in an exemplary embodiment of the present invention, the upward/downward lengths of the n type thermoelectric conversion materials 110 and the p type thermoelectric conversion materials 120 are the same, and the high temperature side electrodes 131 may be provided to be inserted between the n type thermoelectric conversion materials 110 and the p type thermoelectric conversion materials 120 by not more than ⅓ of an upward/downward length of the thermoelectric conversion materials 110 and 120.

Although the contact areas of the thermoelectric conversion materials 110 and 120 become larger as the high temperature side electrodes 131 are inserted between the n type thermoelectric conversion materials 110 and the p type thermoelectric conversion materials 120 deeper, the heat that reaches upper end portions of the high temperature side electrodes 131 (which are inserted between the thermoelectric conversion materials 110 and 120) decreases. Furthermore, it is advantageous to linearly form thermal gradients from the high temperature side end portions to the lower temperature side end portions of the thermoelectric conversion materials 110 and 120 to generate currents, and radial thermal gradients are formed in the internals of the thermoelectric conversion materials 110 and 120 if the high temperature side electrodes 131 are inserted by not less than ⅓ of the lengths of the n type thermoelectric conversion materials 110 and the p type thermoelectric conversion materials 120, and accordingly, the straightness of the currents in the internals of the thermoelectric conversion materials 110 and 120 decreases, resulting in the lowering of the power generation performances of the thermoelectric conversion materials 110 and 120.

Accordingly, to maximize the power generation performances of the thermoelectric conversion materials 110 and 120, the high temperature side electrodes 131 may be inserted to a point which is not more than ⅓ of the lengths from the high temperature side end portions to the low temperature side end portions of the n type thermoelectric conversion materials 110 and the p type thermoelectric conversion materials 120 to be welded in the thermoelectric conversion module 10 according to the exemplary embodiment of the present invention.

However, in another exemplary embodiment of the present invention, the high temperature side electrodes may be inserted to not less than ⅓ of the thermoelectric conversion materials according to the features of the thermoelectric conversion materials and/or the electrodes used in the thermoelectric conversion module 10.

The high temperature side electrode 131 may be formed of a material, properties of which do not change due to oxidation or the like even though the high temperature side electrode 131 directly contacts exhaust gas.

For example, the high temperature side electrode 131 may be formed of an oxide-based thermoelectric conversion material. Because the oxide-based thermoelectric conversion material has an excellent thermal or electrically conductive property and is stable to oxidation at a high temperature, it may be used for the thermoelectric conversion module 10 of the exemplary embodiment that employs a scheme of directly contacting exhaust gas.

In the thermoelectric conversion module 10, diffusion preventing layers 192 may be disposed between the high temperature side electrodes 131 and the n type thermoelectric conversion materials 110 and between the high temperature side electrodes 131 and the p type thermoelectric conversion materials 120 to prevent mutual diffusion of the electrode materials and the thermoelectric conversion materials.

If the high temperature side electrodes 131 and the thermoelectric conversion materials 110 and 120 directly contact each other, the properties thereof change due to the diffusion of the other materials, and thus the thermoelectric efficiencies of the thermoelectric conversion materials 110 and 120 may deteriorate or the electrical (or thermal) conductivity of the high temperature side electrodes 131 may deteriorate. To prevent this, the thermoelectric conversion module 10 may include diffusion preventing layers 192 between the high temperature side electrodes 131 and the thermoelectric conversion materials 110 and 120.

In the thermoelectric conversion module 10, bonding layers for thermal welding may be disposed between the high temperature side electrodes 131 and the n type thermoelectric conversion materials 110 and between the high temperature side electrodes 131 and the p type thermoelectric conversion materials 120.

The high temperature side electrodes 131 and the thermoelectric conversion materials 110 and 120 may be thermally welded to each other. For example, the high temperature side electrodes 131 and the thermoelectric conversion materials 110 and 120 may be blazed to each other. Generally, for blazing, in addition to materials (the high temperature side electrodes and the thermoelectric conversion materials of the present invention) that are targets for coupling, a filler material which is fused by heat and welds the materials that are targets for coupling is necessary.

In the thermoelectric conversion module 10 according to the exemplary embodiment of the present invention, a blazing paster 191 which is a bonding layer for thermal welding is disposed between the high temperature side electrodes 131 and the thermoelectric conversion materials 110 and 120.

Meanwhile, when the high temperature side electrodes 131 and the thermoelectric conversion materials 110 and 120 are coupled to each other in a scheme other than blazing, the thermoelectric conversion module 10 may be constituted without using a blazing paster 191.

The low temperature side electrode 132 may exchange heat with the low temperature passage pipe 30, through which a refrigerant 31 flows, and may discharge thermal energy in the thermoelectric conversion module 10 by use of the refrigerant 31.

The thermoelectric conversion module 10 may further include supporters 140 that are disposed alternately with the high temperature side electrodes 131 to insulate the high temperature side end portions of the n type thermoelectric conversion materials 110 and the p type thermoelectric conversion materials 120 that are connected to each other at the low temperature side end portions thereof.

Referring to FIG. 1, the supporters 140 may be inserted between the n type thermoelectric conversion materials 110 and the p type thermoelectric conversion materials 120, at least parts of which are connected to each other at the low temperature side end portions thereof to be welded.

The plurality of thermoelectric conversion materials 110 and 120 of the thermoelectric conversion module 10 may be connected to each other in series when the n type thermoelectric conversion materials 110 and the p type thermoelectric conversion materials 120 that are connected to each other at the low temperature side end portions thereof are separated from each other at the high temperature side end portions thereof.

The supporters 140 may be disposed on the high temperature side of the thermoelectric conversion module 10 to be disposed alternately with the high temperature side electrodes 131 to insulate the n type thermoelectric conversion materials 110 and the p type thermoelectric conversion materials 120 that are adjacent to each other and are not connected to each other by the high temperature side electrodes 131.

The supporters 140 may be partially inserted between the n type thermoelectric conversion materials and the p type thermoelectric conversion materials that are connected to each other at the low temperature side end portions thereof so that surfaces of the supporters 140 may be supported by the n type thermoelectric conversion materials 110 and opposite surfaces of the supporters 140 may be supported by the p type thermoelectric conversion materials 120. That is, referring to FIG. 1, the supporters 140 may be partially inserted between the n type thermoelectric conversion materials 110 and the p type thermoelectric conversion materials 120 that are connected to each other at the low temperature side end portions thereof, and may support the n type thermoelectric conversion materials 110 and the p type thermoelectric conversion materials 120 such that the n type thermoelectric conversion materials 110 and the p type thermoelectric conversion materials 120 are spaced from each other by a specific distance.

The supporters 140 may be provided to cover the high temperature side end portions of the thermoelectric conversion materials 110 and 120. That is, the supporters 140 may have a shape that extends in a direction (the leftward/rightward direction of FIG. 1) in which the thermoelectric conversion materials 110 and 120 are disposed to cover the high temperature side end portions of the thermoelectric conversion materials 110 and 120.

The supporters 140 may have a T shape. The supporters 140 may have lengths that extend in a direction (the leftward/rightward direction of FIG. 1) in which the thermoelectric conversion materials 110 and 120 are disposed to cover the high temperature side end portions of the thermoelectric conversion materials 110 and 120 and support the high temperature side electrodes 131 that are adjacent to the high temperature side end portions of the thermoelectric conversion materials 110 and 120 at the same time.

The supporters 140 may be disposed between the high temperature side end portions of the thermoelectric conversion materials 110 and 120 and the high temperature passage pipes 20 to insulate the thermoelectric conversion materials and the high temperature passage pipes 20 and support the thermoelectric conversion module and the high temperature side electrodes.

Furthermore, the supporters 140 may protect the thermoelectric conversion materials from an external impact delivered form the passage pipe.

The thermoelectric conversion module 10 may be electrically connected to a load 170 that consumes electric power generated by the thermoelectric conversion materials 110 and 120. A current 11 generated by the thermoelectric conversion module 10 may flow in the arrow direction of in FIG. 1.

The thermoelectric conversion module 10 may further include a clamping member 150 that clamps the plurality of thermoelectric conversion materials 110 and 120, the high temperature side electrodes 131, and the supporters 140.

The clamping member 150 may be configured to couple two members of a C shape while the two members face each other. That is, the clamping member 150 may have a shape in which any one side surface of a rectangular box, a top and a bottom of which are opened, is not provided. The clamping member 150 may fix the plurality of stacked thermoelectric conversion materials 110 and 120, the high temperature electrodes 131, and the supporters 140 while surrounding them.

An internal surface of the clamping member 150, which contacts the thermoelectric conversion materials or the electrodes, may be insulation-coated for insulation. An internal side of the clamping member 150 may be insulation-coated with ceramics to prevent a short circuit from being generated in the internal of the thermoelectric conversion module 10.

The thermoelectric conversion module 10 further includes a case 160 that defines an internal space, in which the thermoelectric conversion materials 110 and 120, the plurality of electrodes 130, and the like are accommodated, and protects components of the thermoelectric conversion module 10 from an external impact or foreign substances.

The case 160 may have a rectangular parallelepiped shape in which a surface of the case 160, which faces the high temperature passage pipe 20, is opened.

The thermoelectric conversion materials 110 and 120, the plurality of electrodes 130, the supporters 140, and the clamping member 150 may be fixed to the internal of the case 160.

The case 160 may be coupled to the high temperature passage pipe 20 and the low temperature passage pipe 30. For example, the case 160 may be blazed to the high temperature passage pipe 20. The internal of the case 160 may be vacuumed or filled with an inert gas.

Figure 2A:
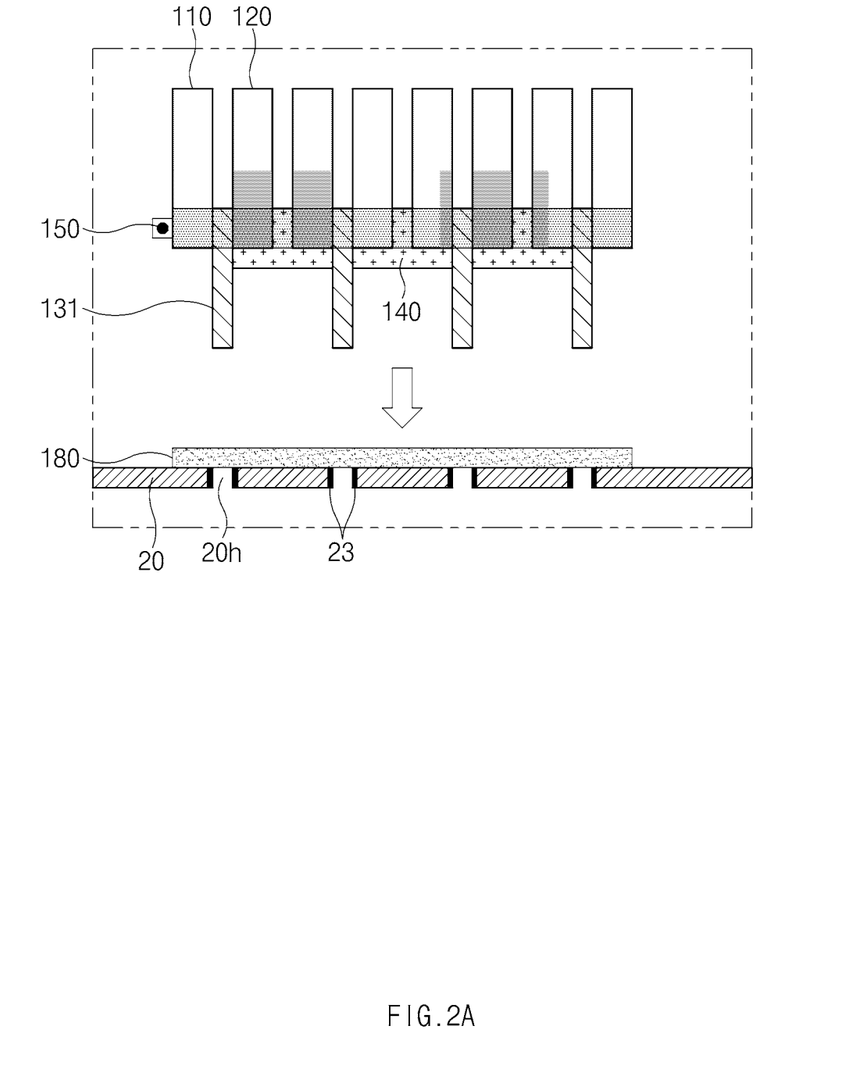
FIG. 2A and FIG. 2B are views illustrating some configurations of the thermoelectric conversion module of FIG. 1.
Figure 2B:
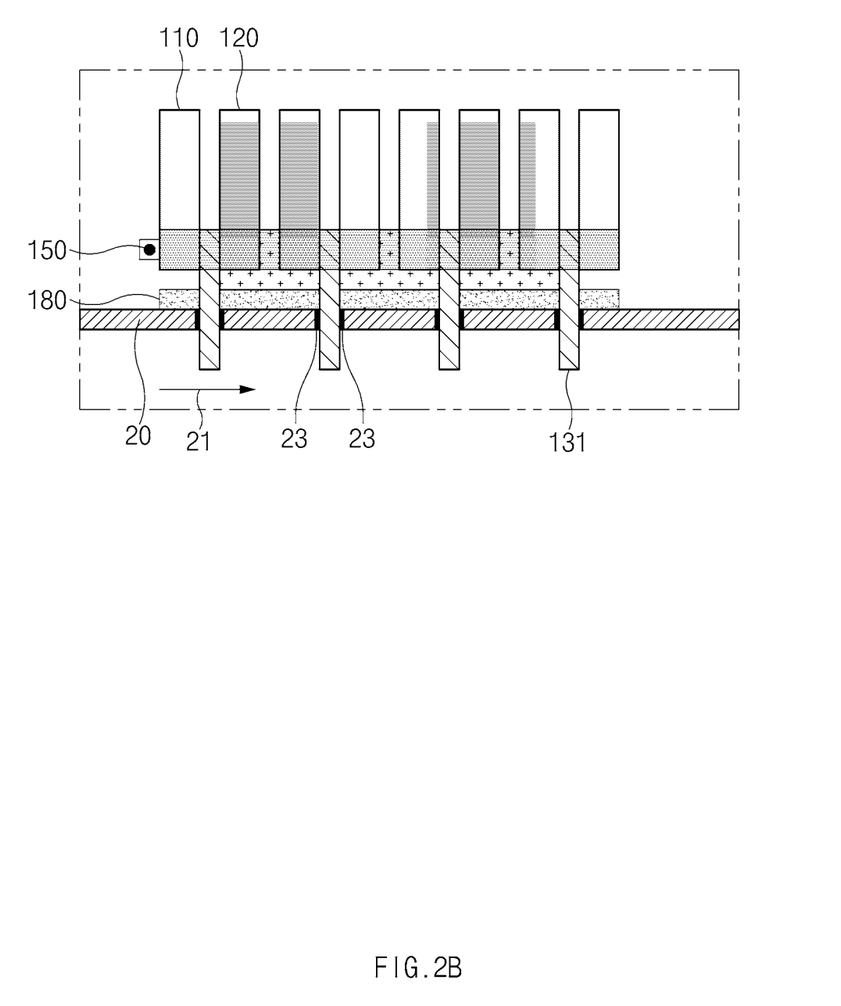
Figure 3:
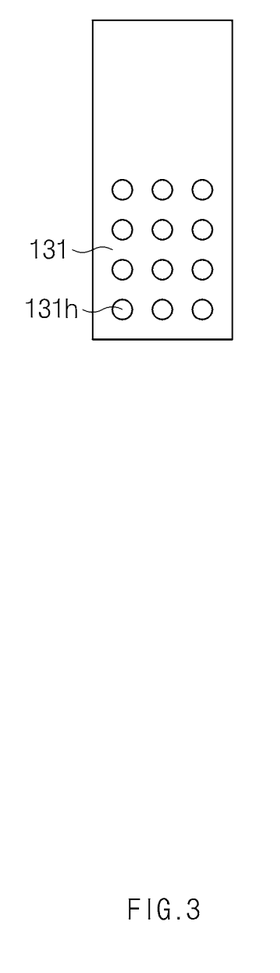
FIG. 3 is a view illustrating some configurations of the thermoelectric conversion module of FIG. 1.

FIG. 2A and FIG. 2B are views illustrating some configurations of the thermoelectric conversion module of FIG. 1. FIG. 3 is a view illustrating some configurations of the thermoelectric conversion module of FIG. 1.

Referring to FIG. 2A and FIG. 2B, the thermoelectric conversion module 10 may further include a gasket 180 disposed between the plurality of thermoelectric conversion materials 110 and 120 and the high temperature passage pipe 20 to prevent an internal fluid from being leaked through the through-hole 20h formed in the high temperature passage pipe 20, through which the heat transfer fluid 21 flows.

The gasket 180 may have gasket through-holes, the number of which corresponds to the number of the high temperature side electrodes 131, such that the high temperature side electrodes 131 pass through the gasket through-holes. The gasket 180 may have gasket through-holes in a shape that corresponds to the shape of the through-holes 20h of the high temperature passage pipe 20.

An insulation layer for insulation may be additionally disposed between the gasket 180 and the thermoelectric conversion materials 110 and 120. For example, the thermoelectric conversion module 10 may be configured to prevent leakage of the heat transfer fluid 21 from the high temperature passage pipe 20 and insulate the high temperature passage pipe 20 at the same time by disposing glass wool between the gasket 180 and the supporters 140.

The high temperature side electrodes 131 may be inserted into the through-holes 20h that pass through the gasket 180 and are formed in the high temperature passage pipe 20.

An insulation layer 23 for insulation from the high temperature side electrode 131 may be provided on an internal surface of the through-hole 20h. When the high temperature passage pipe 20 is formed of a conductor such as metal, because an electric current flows between the high temperature side electrode 131 and the high temperature passage pipe 20 when the high temperature passage pipe 20 contacts the high temperature side electrode 131, the performance of the thermoelectric conversion module may deteriorate. To prevent this, the insulation layer 23 may be provided at a portion of an internal surface of the through-hole 20h, which contacts the high temperature side electrode 131.

Meanwhile, although not illustrated, a portion of the high temperature side electrode 131, which contacts the high temperature passage pipe 20, may be insulation-coated. However, when a whole part of the high temperature side electrode 131, which is inserted into the high temperature passage pipe 20, is insulation-coated, because the heat transfer from the heat transfer fluid 21 to the high temperature electrode 131 may decrease, the insulation coating is limited to a part that contacts the high temperature passage pipe 20 (in the instant case, a margin of a specific length may be provided in consideration of a tolerance).

Referring to FIG. 3, to reduce a flow resistance to the heat transfer fluid 21, a through-hole 131h may be formed at a portion of the high temperature side electrode 131, which is inserted into the high temperature passage pipe 20.

A plurality of through-holes 131h may be formed in the high temperature electrode 131 vertically and horizontally. The through-holes 131h may have a circular shape or other various shapes.

Through this, a flow resistance applied to the heat transfer fluid 21 by the high temperature side electrode 131 inserted into the high temperature passage pipe 20 may be reduced, and heat may be efficiently transferred from the heat transfer fluid 21 to the high temperature side electrode 131. That is, because the heat transfer fluid 21 flows smoothly, the high temperature side electrode 131 may efficiently receive heat from the heat transfer fluid 21 of high temperature introduced from an upper side of the high temperature passage pipe 20.

Furthermore, according to the thermoelectric conversion module 10, it is easy to manufacture the thermoelectric conversion module 10 while the number of thermoelectric conversion materials varies if necessary.

Furthermore, the thermoelectric conversion module 10 according to an exemplary embodiment of the present invention may be used in a high temperature environment, and in the instant case, a high thermoelectric performance may be shown.

Manufacturing Method

Figure 4:
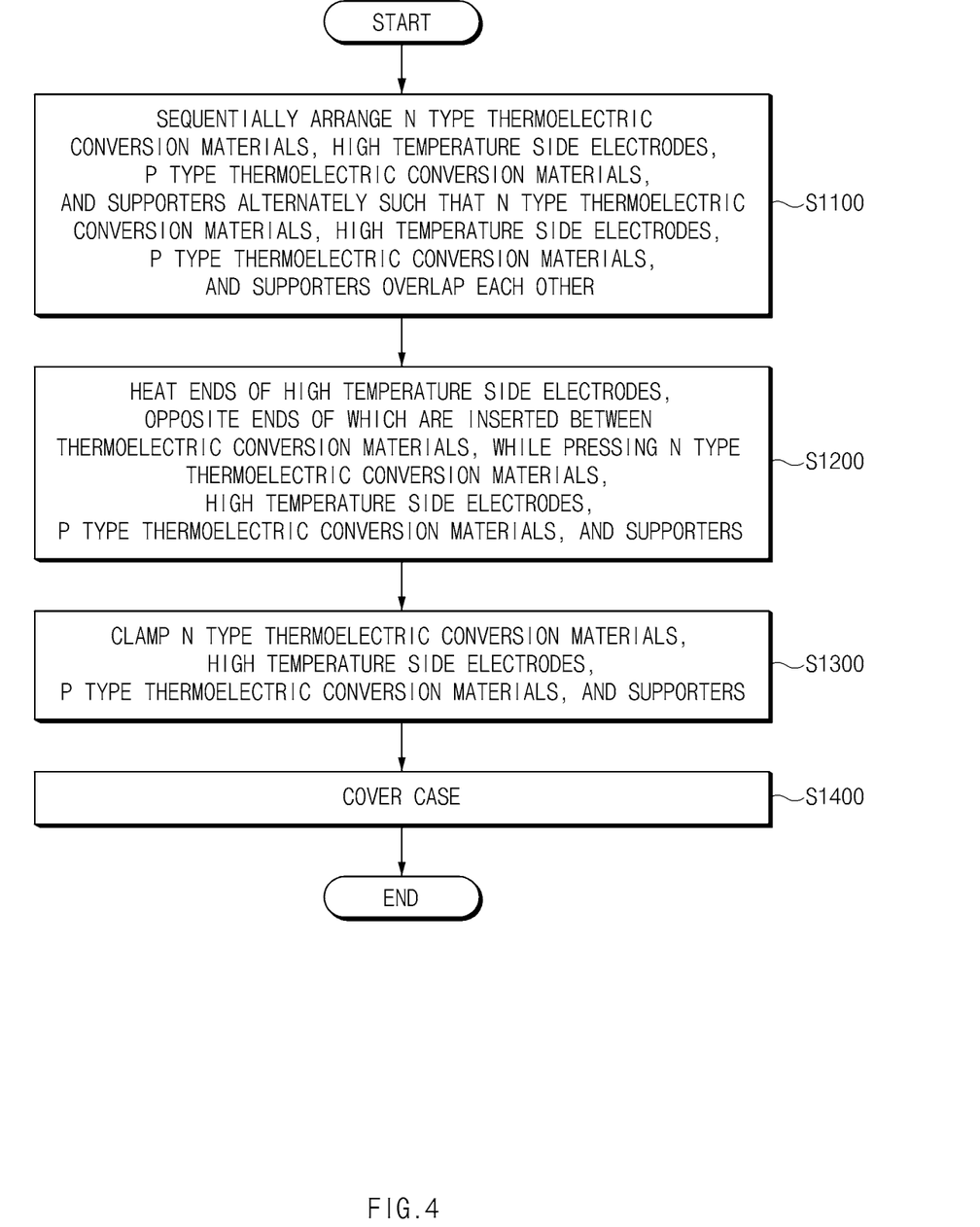
FIG. 4 is a flowchart of a method for manufacturing a thermoelectric conversion module according to an exemplary embodiment of the present invention.
Figure 5:
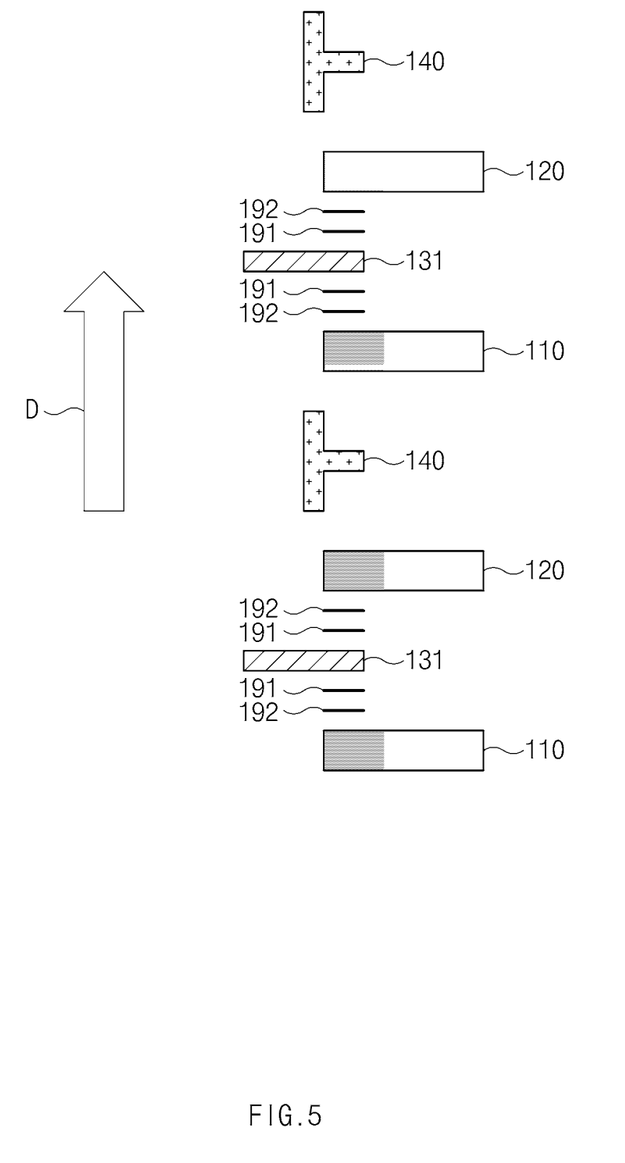
FIG. 5, FIG. 6 and FIG. 7 are views illustrating a method for manufacturing a thermoelectric conversion module according to an exemplary embodiment of the present invention.
Figure 6:
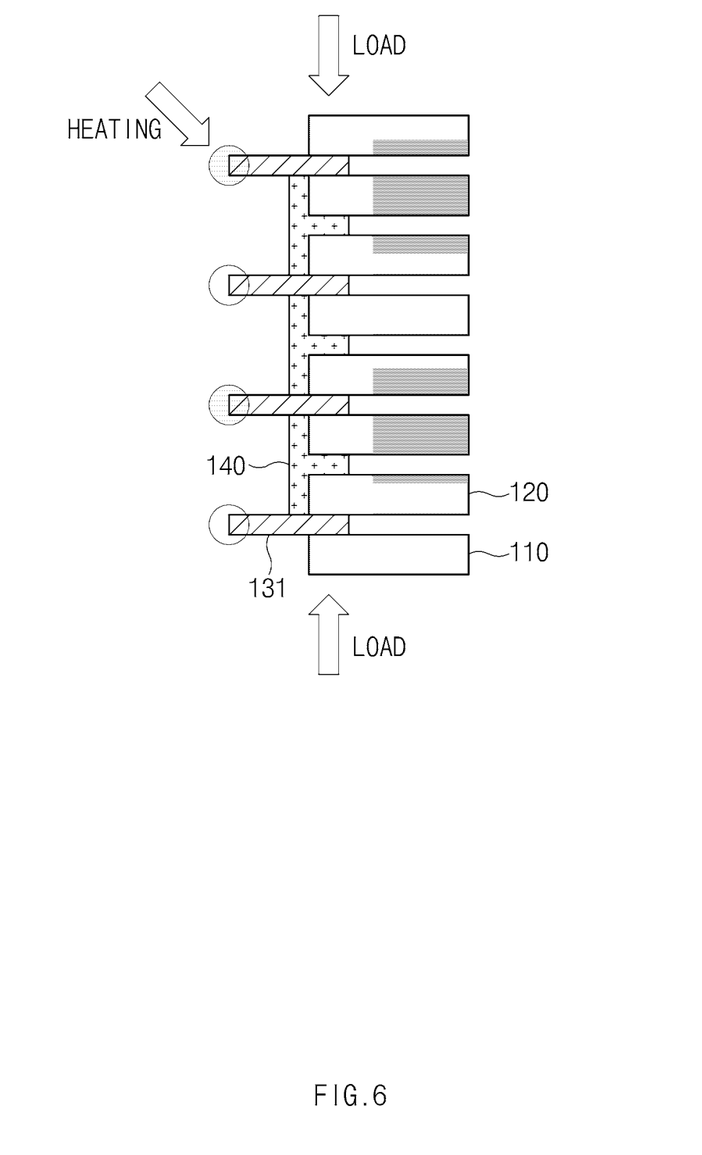
Figure 7:
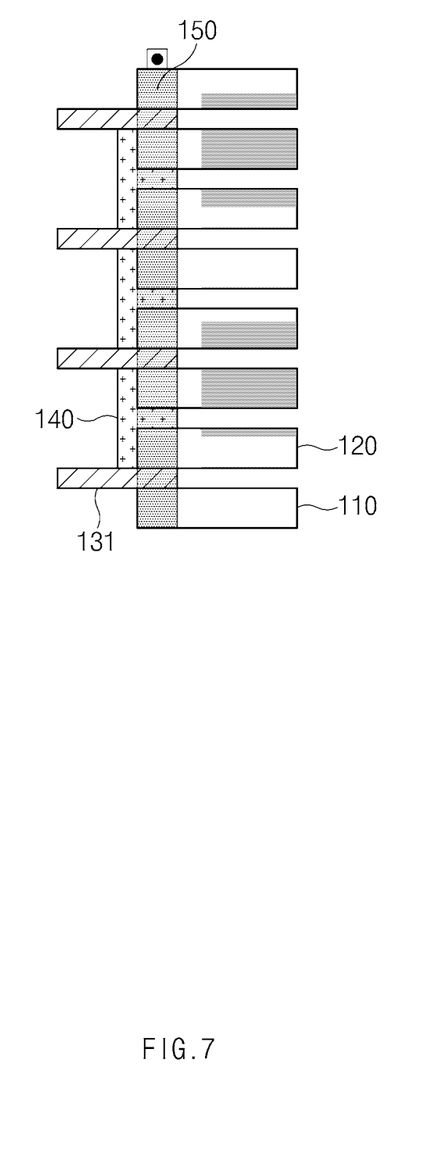

FIG. 4 is a flowchart illustrating a method for manufacturing a thermoelectric conversion module according to an exemplary embodiment of the present invention. FIG. 5, FIG. 6 and FIG. 7 are views illustrating a method for manufacturing a thermoelectric conversion module according to an exemplary embodiment of the present invention.

Referring to FIG. 4, the method for manufacturing a thermoelectric conversion module according to an exemplary embodiment of the present invention may include an operation S1100 of sequentially arranging the n type thermoelectric conversion materials 110, the high temperature side electrodes 131, the p type thermoelectric conversion materials 120, and the supporters 140 alternately such that the n type thermoelectric conversion materials 110, the high temperature side electrodes 131, the p type thermoelectric conversion materials 120, and the supporters 140 overlap each other.

Referring to FIG. 5, in operation S1100, the n type thermoelectric conversion materials 110, the high temperature side electrodes 131, the p type thermoelectric conversion materials 120, and the supporters 140 may be alternately disposed in the sequence to overlap each other.

In operation S1100, for manufacturing convenience and effective welding, the n type thermoelectric conversion materials 110, the high temperature side electrodes 131, the p type thermoelectric conversion materials 120, and the supporters 140 may be stacked in the sequence from the lower side to the upper side with reference to the gravitational direction thereof, as indicated by the arrow D of FIG. 5.

Additionally, in operation 1100, the high temperature side electrode 131 may be inserted to a point which is not more than ⅓ of a length from the high temperature side end portions of the n type thermoelectric conversion material 110 and the p type thermoelectric conversion material 120 to the low temperature side end portions of the n type thermoelectric conversion material 110 and the p type thermoelectric conversion material 120 to be disposed.

Operation S1100 may include disposing bonding layers for thermal welding may be disposed between the high temperature side electrodes 131 and the n type thermoelectric conversion materials 110 and between the high temperature side electrodes 131 and the p type thermoelectric conversion materials 120. Hereinafter, the bonding layer for thermal welding may be a blazing paster (or a filler) 191 in an exemplary embodiment of the present invention.

That is, in operation S1100, the blazing paster 191 may be disposed first before the high temperature side electrode 131 is disposed after the n type thermoelectric conversion material 110 is disposed, and the blazing paster 191 may be disposed first before the p type thermal conversion material 120 is disposed after the high temperature side electrode 131 is disposed.

Operation S1100 may include disposing diffusion preventing layers may be disposed between the high temperature side electrodes 131 and the n type thermoelectric conversion materials 110 and between the high temperature side electrodes 131 and the p type thermoelectric conversion materials 120.

That is, in operation S1100, the diffusion preventing layer 192 may be disposed first before the high temperature side electrode 131 is disposed after the n type thermoelectric conversion material 110 is disposed, and the diffusion preventing layer 192 may be disposed first before the p type thermal conversion material 120 is disposed after the high temperature side electrode 131 is disposed.

That is, in operation S1100, the diffusion preventing layer 192 may be disposed first before the blazing paster 191 is disposed after the n type thermoelectric conversion material 110 is disposed, and the diffusion preventing layer 192 may be disposed first before the p type thermal conversion material 120 is disposed after the blazing paster 191 is disposed.

Meanwhile, different from the one illustrated in FIG. 5, the disposition sequence of the bonding layer (or the blazing paster) and the diffusion preventing layer 192 may be inversed. Accordingly, the bonding layer and the diffusion preventing layer 192 may be disposed such that the diffusion preventing and bonding effects may become higher in consideration of the properties of the materials for the electrodes, the bonding layers, the diffusion preventing layers, and the thermoelectric conversion materials.

Next, the method for manufacturing the thermoelectric conversion module 10 may include an operation S1200 of heating end portions of the high temperature side electrodes 131, opposite end portions of which are inserted between the thermoelectric conversion materials 110 and 120, while pressing the n type thermoelectric conversion materials 110, the high temperature side electrodes 131, the p type thermoelectric conversion materials 120, and the supporters 140 to weld the n type thermoelectric conversion materials 110, the high temperature side electrodes 131, the p type thermoelectric conversion materials 120, and supporters 140.

Referring to FIG. 6, in a state in which the n type thermoelectric conversion materials 110, the high temperature side electrodes 131, the p type thermoelectric conversion materials 120, and the supporters 140 are stacked, the n type thermoelectric conversion materials 110, the high temperature side electrodes 131, the p type thermoelectric conversion materials 120, and the supporters 140 may be welded to each other by heating external end portions of the high temperature side electrodes 1321 while applying forces from the opposite sides of the stack.

The high temperature side electrodes 131 may be formed of a heat-resistant material by which the properties of the high temperature side electrodes 131 are not changed even by the high temperature of the exhaust gas. Accordingly, end portions of the high temperature side electrodes 131 may be heated and blazed by fusing the blazing pasters 191 by use of conduction heat.

Conventionally, even the thermoelectric conversion materials are exposed to high temperature when the thermoelectric conversion module is welded so that the materials are oxidized or the properties of the materials deteriorate. According to the manufacturing method of the present invention, the high temperature side electrodes 131 may be heated and welded by conduction of heat by use of a heater of high temperature or radiation of laser beams. Through this, the properties of the thermoelectric conversion materials may be prevented from deteriorating due to heat in the manufacturing process.

Furthermore, because it is easily to apply heat to external end portions of the high temperature side electrodes 131 as the external end portions of the high temperature side electrodes 131 protrude side by side to one side, the manufacturing may become simpler and a possibility of other members being exposed to high temperature due to manufacturing tolerance is low as compared with an existing welding method of directly heating the bonding layer.

Next, the method for manufacturing the thermoelectric conversion module may include an operation S1300 of clamping the n type thermoelectric conversion materials 110, the high temperature side electrodes 131, the p type thermoelectric conversion materials 120, and the supporters 140.

Referring to FIG. 7, after the welding, the n type thermoelectric conversion materials 110, the high temperature side electrodes 131, the p type thermoelectric conversion materials 120, and the supporters 140 may be clamped to be securely fixed.

Next, the method for manufacturing the thermoelectric conversion module 10 may include an operation S1400 of covering the case 160.

Through this, all the devices of the thermoelectric conversion module may be manufactured in a package.

Meanwhile, operation S1400 may include an operation of vacuuming the internal of the case 160 or filling an inert gas.

When one surface of the case 160 is opened and the thermoelectric conversion module 10 is cased through welding to the pipe, through which the heat transfer fluid flows, operation S1400 may include an operation of welding the case 160 to the pipe, through which the heat transfer fluid flows, in a state in which the components of the thermoelectric conversion module 10 are fixed to the internal of the case 160. The case 160 may be welded in a thermal welding scheme, for example, may be blazed and welded to the pipe, through which the heat transfer fluid flows.

Meanwhile, although not illustrated, the locations of the n type thermoelectric conversion materials 110 and the p type thermoelectric conversion materials 120 may be inversed, and even in the instant case, the same scheme may be applied except that the locations of the n type thermoelectric conversion materials 110 and the p type thermoelectric conversion materials 120 are inversed.

Figure 8:
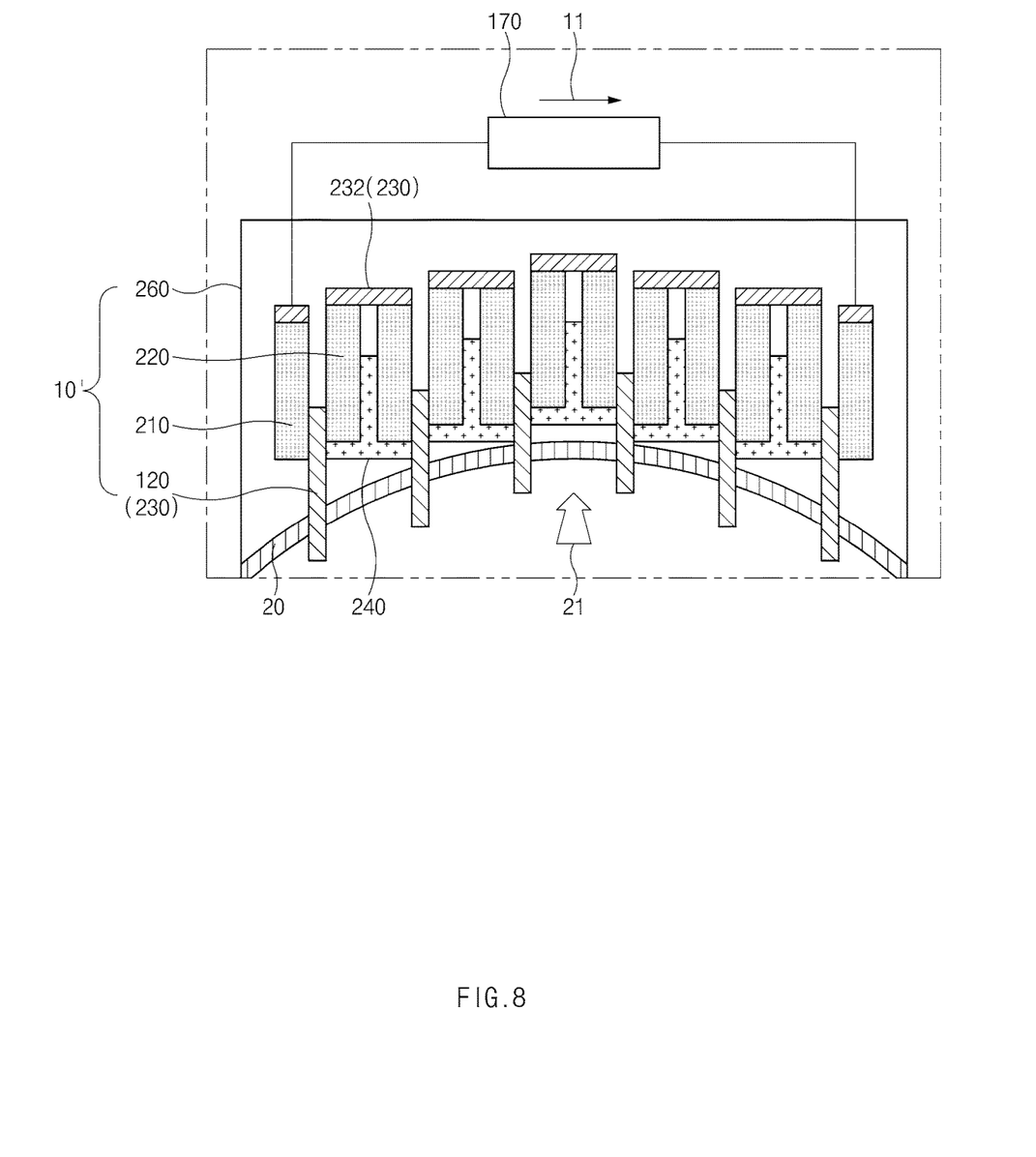
FIG. 8 is a conceptual view illustrating a thermoelectric conversion module according to various exemplary embodiments of the present invention.

FIG. 8 is a conceptual view illustrating a thermoelectric conversion module 10' according to various exemplary embodiments of the present invention.

Hereinafter, different points of the thermoelectric conversion module 10' according to the various exemplary embodiments of the present invention from the thermoelectric conversion module 10 according to the various exemplary embodiments will be mainly described with reference to FIG. 8. Hereinafter, the configurations that are the same as the configurations of the thermoelectric conversion module 10 according to the various exemplary embodiments or may be understood as equivalents by an ordinary person in the art will have the same reference numerals.

FIG. 8 illustrates a cross-section of the high temperature passage pipe 20 of FIG. 1, taken from a different angle, and the flow direction of the heat transfer fluid 21 is a direction from the front side to the rear side of FIG. 8.

According to the exemplary embodiment of the present invention, the plurality of thermoelectric conversion materials 210 and 220 may be disposed in a circumferential direction of the high temperature passage pipe 20. The high temperature side electrode 231 may be disposed such that internal end portions of the plurality of high temperature side electrodes, which are inserted into the pipe, are curved in a direction in which the pipe is curved.

The conventional thermoelectric conversion module 10' absorbs thermal energy through conduction of heat while a substrate contacts a surface of a pipe, through which a fluid of high temperature flows, in a state in which a high temperature side electrode is positioned on the substrate. As such, when the shape of the pipe is curved, thermal energy cannot be transferred well through the substrate which is flat.

The thermoelectric conversion module 10' according to an exemplary embodiment of the present invention employs a scheme in which the high temperature side electrode 231 is directly inserted into the internal of the pipe, through which a fluid of high temperature flows, thermal energy may be effectively absorbed even when the thermoelectric conversion module 10' is disposed in a curved pipe if the length of the high temperature side electrode 231 is changed.

As such, the high temperature side electrodes 231 may be disposed such that end portions of the plurality of high temperature side electrodes 231, which are inserted into the pipe, are curved in a direction in which the pipe is curved. That is, the length of a portion of the high temperature side electrodes 231, which is inserted into the pipe, may be a specific value or more.

To achieve this, the plurality of high temperature side electrodes 231 may be different.

Furthermore, as will be described below, the heights of the thermoelectric conversion materials 210 and 220 may be different.

A low temperature side electrode, and an n type thermoelectric conversion material and a p type thermoelectric conversion material that are connected to each other by the low temperature side electrode will be named a thermoelectric element set.

Referring to FIG. 8, a plurality of pi-shaped thermoelectric element sets may be disposed to be disposed in a circumferential direction of a high temperature passage pipe 20, through which a heat transfer fluid 21 flows, and such that high temperature side end portions of the thermoelectric element sets, which are adjacent to the pipe, are curved in a direction in which the pipe is curved.

That is, the heights of the pi-shaped thermoelectric element sets may be come lower as they go from the left side to the right side with respect to the pi-shaped thermoelectric element set located on the upper side of the high temperature passage pipe.

When expressed in a different way, the heights of the plurality of pi-shaped thermoelectric element sets may be different such that the high temperature side end portions of the thermoelectric element sets are located within a specific distance from the pipe.

The thermoelectric conversion module configured in the instant way may effectively absorb thermal energy as the high temperature side electrodes thereof are inserted into the pipe even when the thermoelectric conversion module is disposed in a cylindrical pipe.

Through this, electric power may be effectively generated by mounting a thermoelectric conversion module in a high temperature side passage pipe having a circular cross-section as in an exhaust pipe of a vehicle.

The thermoelectric conversion module 10 and 10' according to exemplary embodiments of the present invention may be disposed in a vehicle to generate electric power by use of heat of exhaust gas.

In the instant case, the high temperature side electrodes 131 and 231 of the thermoelectric conversion module 10 and 10' may be inserted into the through-holes formed in the exhaust pipe to obtain heat while directly contacting exhaust gas. The high temperature side electrodes 131 and 231 may transfer the obtained heat to the plurality of thermoelectric conversion materials 110, 120, 210, and 220. To achieve this, the high temperature side electrodes 131 and 231 may have a shape that protrudes toward the exhaust pipe with respect to the high temperature side end portions of the plurality of thermoelectric conversion materials 110, 120, 210, and 220.

Because the vehicle including the thermoelectric conversion module 10 and 10' configured in the instant way produces electric power by use of waste heat in exhaust gas, the fuel efficiency of the vehicle may be improved by reducing a load applied to the power supply device (a battery or a fuel cell) of the vehicle.

In the thermoelectric conversion module of the present invention configured in the way, because thermal energy is supplied to the thermoelectric conversion materials by the high temperature side electrodes while the heat transfer fluid (exhaust gas of the vehicle or the like) of high temperature and the high temperature side electrodes directly contact each other, the thermoelectric performance may be improved as compared with a conventional technology, by increasing the high temperature parts of the thermoelectric conversion module to a high temperature.

Furthermore, because the components of the thermoelectric conversion module may be supported and fixed by the supporters and the clamping member and is packaged into a module by the case, the thermoelectric performance may be maintained by improving the durability of the thermoelectric conversion module exposed to high temperature and vibration.

By use of the method for manufacturing the thermoelectric conversion module of the present invention having the above-mentioned configuration, the properties of the thermoelectric conversion material may be prevented from deteriorating due to high temperature and the thermoelectric conversion module may be simply manufactured.

For convenience in explanation and accurate definition in the appended claims, the terms "upper", "lower", "inner", "outer", "up", "down", "upper", "lower", "upwards", "downwards", "front", "rear", "back", "inside", "outside", "inwardly", "outwardly", "internal", "external", "inner", "outer", "forwards", and "backwards" are used to describe features of the exemplary embodiments with reference to the positions of such features as displayed in the figures.

The foregoing descriptions of specific exemplary embodiments of the present invention have been presented for purposes of illustration and description. They are not intended to be exhaustive or to limit the present invention to the precise forms disclosed, and obviously many modifications and variations are possible in light of the above teachings. The exemplary embodiments were chosen and described to explain certain principles of the present invention and their practical application, to enable others skilled in the art to make and utilize various exemplary embodiments of the present invention, as well as various alternatives and modifications thereof. It is intended that the scope of the present invention be defined by the Claims appended hereto and their equivalents.

What is claimed is:

1. A thermoelectric conversion module comprising:
   a plurality of n type thermoelectric conversion materials and a plurality of p type thermoelectric conversion materials that are disposed alternately; and
   a plurality of electrodes that connect the plurality of thermoelectric conversion materials disposed alternately on high temperature sides and low temperature sides of the plurality of thermoelectric conversion materials alternately,
   wherein the plurality of electrodes includes: a high temperature side electrode protruding towards a pipe, through which a heat transfer fluid flows, with respect to high temperature side end portions of the plurality of thermoelectric conversion materials and to be inserted into a through-hole formed at the pipe to obtain heat while directly contacting the heat transfer fluid and to transfer the obtained heat to the plurality of thermoelectric conversion materials, and
   wherein the high temperature side electrode is partially inserted between an adjacent n type thermoelectric conversion material of the plurality of n type thermoelectric conversion materials and an adjacent p type thermoelectric conversion material of the plurality of p type thermoelectric conversion materials to be secured.

2. The thermoelectric conversion module of claim 1, wherein the high temperature side electrode is inserted to a point that corresponds to not more than one third of a length from the high temperature side end portions to low temperature side end portions of the n type thermoelectric conversion material and the p type thermoelectric conversion material to be secured.

3. The thermoelectric conversion module of claim 1, further including:
diffusion preventing layers disposed between the high temperature side electrode and the n type thermoelectric conversion material and between the high temperature side electrode and the p type thermoelectric conversion material to prevent mutual diffusion of an electrode material and a thermoelectric material.

4. The thermoelectric conversion module of claim 1, further including:
bonding layers disposed between the high temperature side electrode and the n type thermoelectric conversion material and between the high temperature side electrode and the p type thermoelectric conversion material for thermal welding.

5. The thermoelectric conversion module of claim 1, wherein the high temperature side electrode is further provided with a through-hole at a portion of the high temperature side electrode, which is inserted into the pipe, through which the heat transfer fluid flows, to decrease a flow resistance caused to the heat transfer fluid by the portion of the high temperature side electrode.

6. The thermoelectric conversion module of claim 1, further including:
a supporter disposed alternately with the high temperature side electrode to insulate high temperature side end portions of the n type thermoelectric conversion material and the p type thermoelectric conversion material that are connected to each other at low temperature side end portions of the n type thermoelectric conversion material and the p type thermoelectric conversion material.

7. The thermoelectric conversion module of claim 6, wherein the supporter is partially inserted between the n type thermoelectric conversion material of the plurality of n type thermoelectric conversion materials and the p type thermoelectric conversion material of the plurality of n type thermoelectric conversion materials, wherein the n type thermoelectric conversion material and the p type thermoelectric conversion material are connected to each other at the low temperature side end portions of the n type thermoelectric conversion material and the p type thermoelectric conversion material to be secured, and
wherein a first side surface of the supporter is supported by the n type thermoelectric conversion material and a second surface of the supporter is supported by the p type thermoelectric conversion material.

8. The thermoelectric conversion module of claim 6, wherein the high temperature side electrode has a plate shape which is partially inserted between the n type thermoelectric conversion material and the p type thermoelectric conversion material, which are adjacent to each other and are not connected to each other at the low temperature side end portions of the n type thermoelectric conversion material and the p type thermoelectric conversion material, and
wherein the supporter covers the high temperature side end portions of the thermoelectric conversion materials, which are adjacent to each other and are connected to each other at the low temperature side end portions of the thermoelectric conversion materials, and supports the high temperature side electrode on a side thereof.

9. The thermoelectric conversion module of claim 1, further including:
a supporter disposed alternately with the high temperature side electrode to insulate the high temperature side end portions of the plurality of thermoelectric conversion materials, which are not connected to each other by the high temperature side electrode; and
a clamping member clamping the plurality of thermoelectric conversion materials, the high temperature side electrode, and the supporter,
wherein the high temperature side electrode is partially inserted between the n type thermoelectric conversion material and the p type thermoelectric conversion material to be secured therebetween.

10. The thermoelectric conversion module of claim 1, further including:
a gasket disposed between the plurality of thermoelectric conversion materials and the pipe to prevent an internal fluid from being leaked through the through-hole formed at the pipe,
wherein the high temperature side electrode penetrates the gasket to be inserted into the through-hole.

11. The thermoelectric conversion module of claim 1, wherein the plurality of thermoelectric conversion materials is disposed in a circumferential direction of the pipe, and
wherein the plurality of high temperature side electrodes is disposed such that internal end portions of the plurality of high temperature side electrodes, which are inserted into the pipe, form a curve which is curved in a direction in which the pipe is curved.

12. The thermoelectric conversion module of claim 1, when a set including a low temperature side electrode, and an n type thermoelectric conversion material of the n type thermoelectric conversion materials and a p type thermoelectric conversion of the p type thermoelectric conversion materials, wherein the n type thermoelectric conversion material and the p type thermoelectric conversion material are connected to each other by the low temperature side electrode, is defined as a pi type thermoelectric element set,
wherein a plurality of pi type thermoelectric element sets is disposed in a circumferential direction of the pipe such that high temperature side end portions of the plurality of pi type thermoelectric element sets, which is adjacent to the pipe, form a curve which is curved in a direction in which the pipe is curved.

13. The thermoelectric conversion module of claim 1, further including an insulation layer between portions of the high temperature side electrodes, which pass through the pipe, and the pipe for insulation of the high temperature side electrodes and the pipe.

* * * * *